United States Patent
Kim et al.

[11] Patent Number: 5,897,353
[45] Date of Patent: Apr. 27, 1999

[54] METHOD OF FORMING DIELECTRIC FILM OF SEMICONDUCTOR MEMORY DEVICE

[75] Inventors: Moon Hwan Kim; Yong Taek Eom, both of Kyoungki-Do, Rep. of Korea

[73] Assignee: Hyundai Electronics Industries Co., Ltd., Rep. of Korea

[21] Appl. No.: 08/963,351

[22] Filed: Nov. 3, 1997

[30] Foreign Application Priority Data

Dec. 24, 1996 [KR] Rep. of Korea ................... 96-71404

[51] Int. Cl.⁶ ........................................... H01L 21/8247
[52] U.S. Cl. .................................... 438/261; 438/704
[58] Field of Search ........................... 438/257–267, 438/704

[56] References Cited

U.S. PATENT DOCUMENTS

| | | | |
|---|---|---|---|
| 5,019,527 | 5/1991 | Ohshima et al. ................ | 437/43 |
| 5,120,670 | 6/1992 | Bergmont . | |
| 5,145,797 | 9/1992 | Nakanishi . | |
| 5,208,175 | 5/1993 | Choi et al. . | |
| 5,258,095 | 11/1993 | Nagata et al. . | |
| 5,304,829 | 4/1994 | Mori et al. ................ | 257/324 |
| 5,342,801 | 8/1994 | Perry et al. . | |
| 5,661,056 | 8/1997 | Takeuchi ................ | 438/261 |

*Primary Examiner*—Richard A. Booth
*Attorney, Agent, or Firm*—Blakely Sokoloff Taylor & Zafman

[57] ABSTRACT

A method of forming a stable type of dielectric film of flash EEPROM by preventing forming of unusual type of oxide film. The method of manufacturing dielectric film comprising the steps of: forming a first polysilicon film, a first dielectric film and a second polysilicon film on the active region of a semiconductor substrate sequentially; patterning said second polysilicon film, the first dielectric film and the first polysilicon film in the same size respectively; forming a curved surface on the side wall of the first dielectric film using wet etching technique in order to accelerate the growth of second dielectric film on the side wall of the first polysilicon film during the subsequent oxidation process; and forming the second dielectric film on the exposed surfaces of the patterned first polysilicon film, first dielectric film, and second polysilicon film using thermal oxidation process.

8 Claims, 3 Drawing Sheets

METHOD OF FORMING DIELECTRIC FILM OF SEMICONDUCTOR MEMORY DEVICE

BACKGROUND OF THE INVENTION

1. Field of the Invention

The present invention relates generally to the method of manufacturing semiconductor device, more specially to the method of forming dielectric film of triple polytype flash electrically erasable programmable read only memory (hereinafter, refer to as EEPROM) cells displaying a multiple layer structure.

2. Description of Prior Art

A conventional method of forming triple poly type of EEPROM cells can be explained with reference to FIG. 1.

First, a gate oxide film (which is not shown) is formed on the active region of a semiconductor substrate (10), which has been divided into active and field regions, and the a first polysilicon film for making a floating gate is formed on the gate oxide film. The first polysilicon film is to remain on the active region by patterning it through photolithography. Then ONO (oxide/nitride/oxide, 12,13,14) forms as a first dielectric film and a second polysilicon film forms thereon subsequently, and the control gate (15) forms by patterning the second polysilicon film through photolithography. The first dielectric films (12,13,14) and the first polysilicon film are etched sequentially through a so-call self-aligned etch so that a structure consisting of the floating gate (11), the first dielectric film (12,13,14) and the control gate (15) forms on the semiconductor substrate. Thereafter, the second dielectric film (16) forms outside the entire structure through an oxidation process, and a third polysilicon film (17) forms in order to create a select gate outside the entire structure.

In the conventional method stated above, ONO film forms as first dielectric film (12,13,14) as the first polysilicon film undergoes through a thermal oxidation process. However, in order to forbid the overgrowth of the dielectric film because of the reduction of capacitance which occurs when the dielectric film grows excessively thick, impurities are not fully implanted to the first polysilicon film. Accordingly, when the second dielectric film (16) forms through the oxidation of polysilicon film after the first dielectric film and the first polysilicon film are etched through the self-aligned etch, then the oxide film near the first polysilicon film do not grow thick enough to the extent necessary and changes into an unusual type of oxide film (so-called, Dog ear, de). FIGS. 2 and 3 show TEM (tunneling electron microscope) of a sample formed in accordance with conventional method as mentioned above, and also SEM (scanning electron microscope), which illustrates the section of EEPROM cells formed in a conventional semiconductor manufacturing process. These Figures show that the unusual type of oxidation (de), which is made from the first polysilicon film, forms at the side walls parts of the floating gate (11).

Also, after the second polysilicon film has been etched through the conventional method, overetching should be implemented to get rid of nitride portion existing in the first dielectric film consisting of ONO film in the field region. This causes the loss of oxide film in the field region, which does not have the first polysilicon film during the self-aligned etch, thereby a defect results since the thickness of the oxide film decreases.

SUMMARY OF THE INVENTION

An object of this invention is to provide a method of forming a stable type of dielectric film of flash EEPROM by preventing forming of unusual type of oxide film.

The invention provides a method of manufacturing a semiconductor device which comprises the steps of: forming a first polysilicon film, a first dielectric film and a second polysilicon film on the active region of a semiconductor substrate sequentially; patterning said second polysilicon film, the first dielectric film and the first polysilicon film in the same size respectively; forming a curved surface on the side wall of the first dielectric film using wet etching technique in order to accelerate the growth of second dielectric film on the side wall of the first polysilicon film during the subsequent oxidation process; and forming the second dielectric film on the exposed surfaces of the patterned first polysilicon film, first dielectric film, and second polysilicon film using thermal oxidation process.

DETAILED DESCRIPTION OF PREFERRED EMBODIMENT

Figure 1:
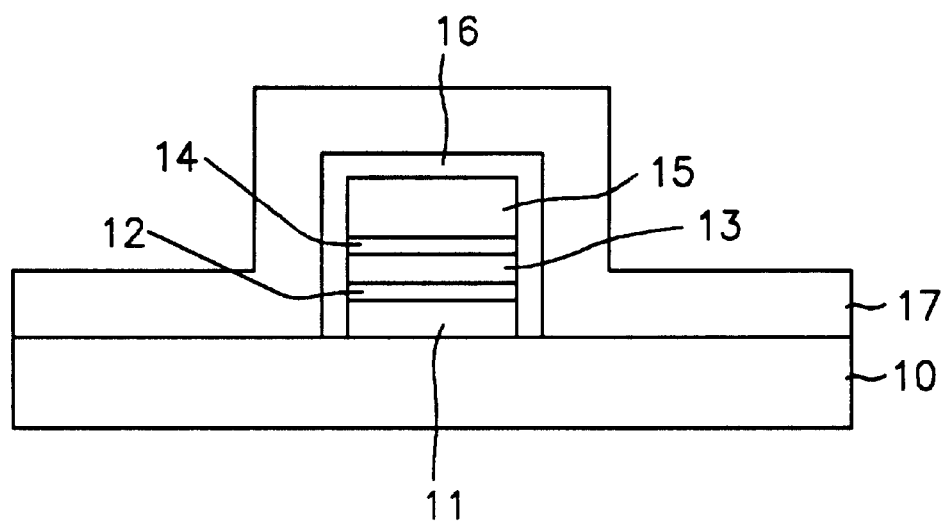
FIG. 1 shows a sectional view of flash EEPROM of triple poly structure in accordance with conventional art.
Figure 4:
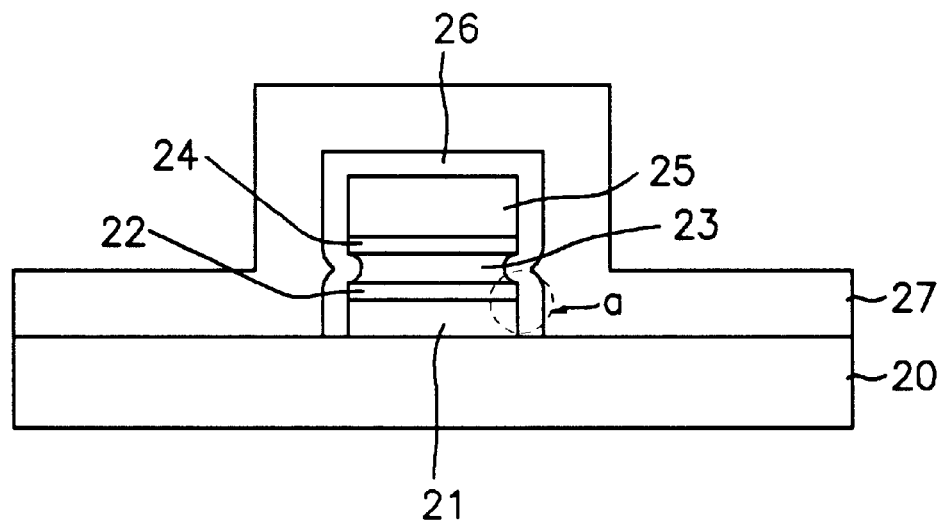
FIG. 4 shows a sectional view of flash EEPROM of triple poly structure in accordance with this invention.
Figure 2:
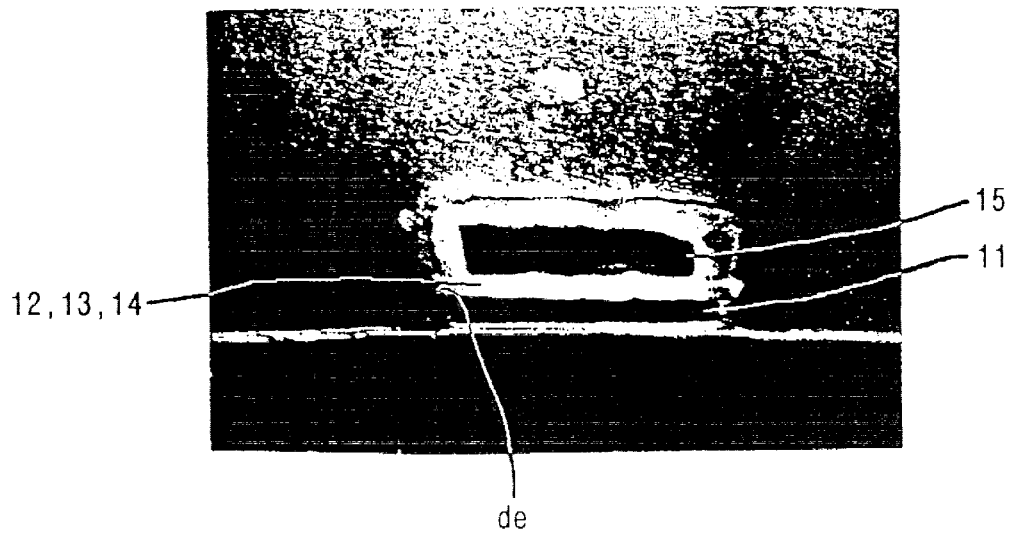
FIGS. 2 and 3 are photographs which show sections of flash EEPROM of triple poly structure in accordance with conventional art.
Figure 3:
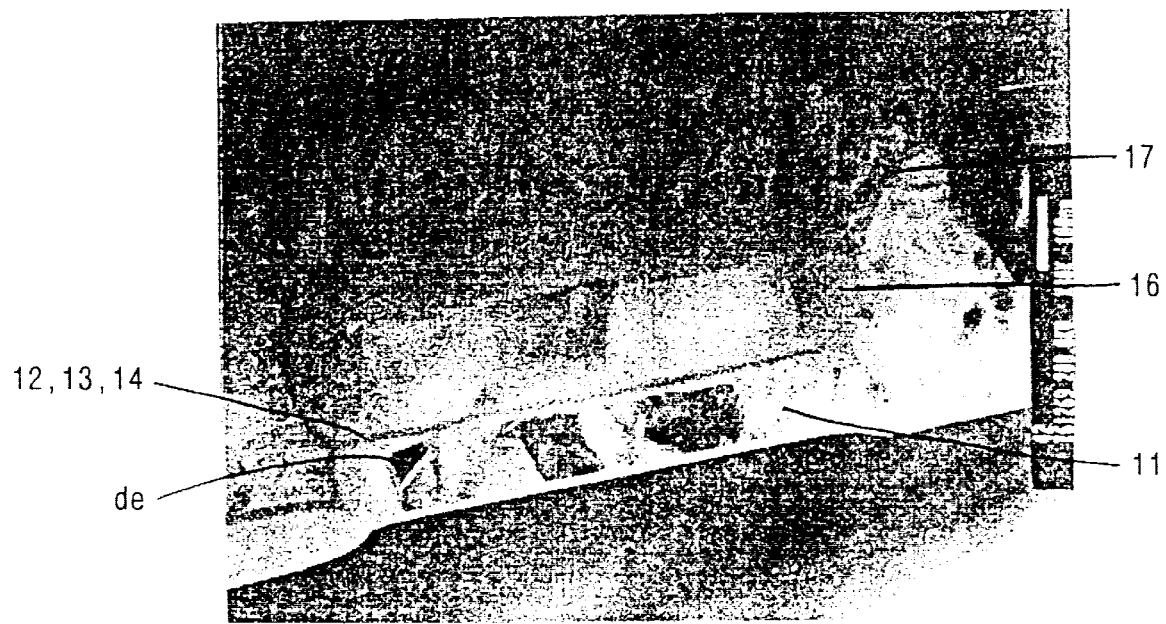

FIG. 4 is a sectional view which shows flash EEPROM cells manufacturing process of triple poly structure in accordance with an embodiment of the invention.

As shown in the above drawing, a gate oxide (which is not shown) is formed on the semiconductor substrate (20) which has been divided into active region and field region. The first polysilicon film for making a floating gate is deposited on the gate oxide film and the first polysilicon film is to remain on the active region by patterning it through photolithography.

Then, ONO (oxide/nitride/oxide, 22,23,24) film, for example, as the first dielectric film is formed on the first polysilicon film and the second polysilicon film is formed on the ONO film. From the second polysilicon film, control gate (2) is formed by patterning it through photolithography process. Then, the first dielectric film (22,23,24) and the first polysilicon film are etched sequentially through the self-aligned etch process, so that a structure, which consists of floating gate (21), first dielectric film (22,23,24) and control gate (25) is formed from the surface of the semiconductor substrate. After a cleansing process is implemented, the concave side is formed on the side wall of the nitride film (23), which is one of the first dielectric film between the first polysilicon film and the second polysilicon film, through implementing the wet etching technique using phosphoric acid. When implementing the wet etching process using phosphoric acid, it is desirable to remove the nitride film, about 100–500 Å.

Next, the second dielectric film (26) is formed on the whole surface of the structure by implementing thermal oxidation process, whereby the third polysilicon (27) for making select gate is formed outside the whole structure.

Figure 5:
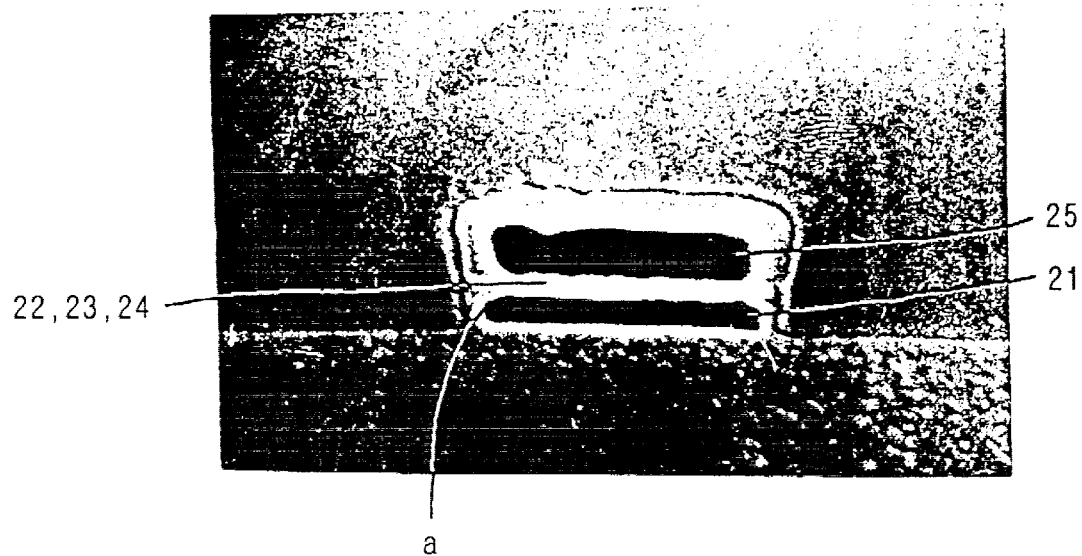
FIGS. 5 and 6 are photographs which show sections of flash EEPROM of triple poly structure in accordance with this invention.
Figure 6:
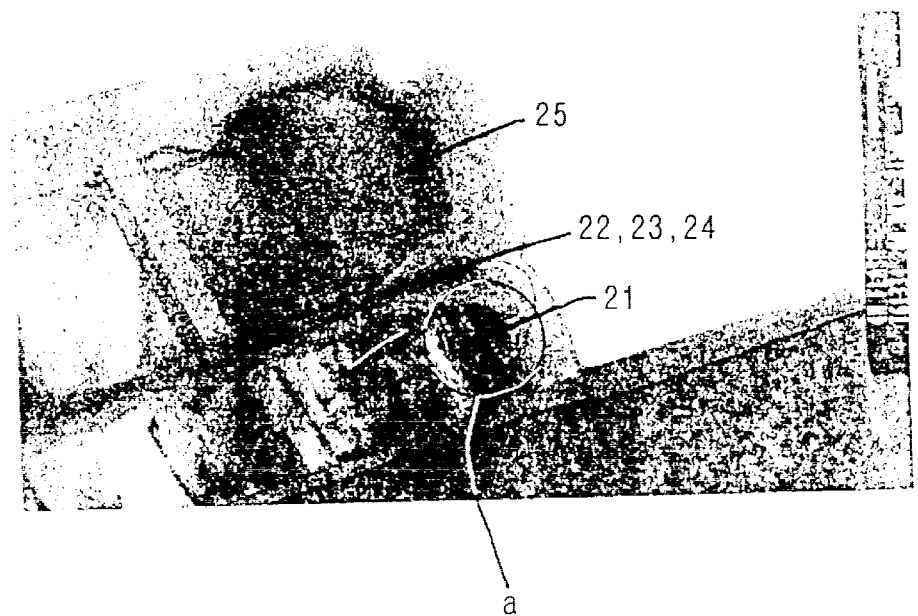

FIGS. 5 and 6 are TEM (tunneling electron microscope) photography of the sample, which is formed in accordance with this invention, and SEM (scanning electron microscope) photography displaying a section of EEPROM cells. As mentioned above, the edges of the first polysilicon film, which causes obstacles to thermal oxidation process for forming the second dielectric film, can be removed by forming a concavity on the side wall of the nitride portion of the first dielectric film and accelerating the thermal oxidation in this area. That is, the conventional, unusual type of profile can be mitigated by making the dielectric film (a) at the edges of the first polysilicon film rounded.

Also, the loss of thickness in the oxide film on the field region can be prevented since the remaining nitride film around the field region can be removed through the wet etching technique using said phosphoric acid, without overetching the first dielectric film during the self-aligned etching process.

On the other hand, the same effect can be obtained by forming curved area not on the nitride film, but on the oxide film of the first dielectric film through the wet etching technique using a buffered oxide etchant (BOE), in the other embodiment. In this case, there is an advantage of omitting special bath since the bath is not contaminated. However, the rounding effect occurring at the edges of the polysilicon film is not sufficient in comparison to the case of using phosphoric acid, and it is not possible to remove the remaining nitride film on the field region.

According to the invention, a stable type of dielectric film can be formed during the manufacturing EEPROM cell of the triple poly structure, so that the device property can be enhanced.

While the invention has been depicted, described, and is defined by reference to preferred embodiment of the invention, such reference does not imply a limitation on the invention, and no such limitation is to be inferred. The invention is capable of various modification, alteration, and equivalents in form and function, as will occur to those ordinarily skilled in the pertinent arts.

What is claimed is:

1. A method of manufacturing a semiconductor device comprising the steps of:

forming a first polysilicon film, a first dielectric film, and a second polysilicon film on the active region of a semiconductor substrate sequentially;

patterning the second polysilicon film, the first dielectric film, and first polysilicon film so that the sidewalls are aligned to one another;

forming a rounded surface on the side wall of the first dielectric film through the process of wet etching in order to accelerate the growth of a second dielectric film on the side wall of the first polysilicon film in a subsequent thermal oxidation process;

forming said second dielectric film on the exposed surfaces of the patterned first polysilicon film, first dielectric film, and second polysilicon film through said thermal oxidation process.

2. The method of claim 1, wherein said second dielectric film at the edges of the first polysilicon film is rounded through a thermal oxidation process in order to form the second dielectric film.

3. The method of claim 1, wherein the first dielectric film is an ONO (oxide/nitride/oxide) film.

4. The method of claim 3, wherein the rounded surface is formed on the nitride film while wet etching the first dielectric film.

5. The method of claim 4, wherein a solution of phosphoric acid is used in wet etching.

6. The method of claim 3, wherein the rounded surface is formed on the oxide film while wet etching the first dielectric film.

7. The method of claim 6, wherein a BOE (buffered oxide etchant) is used in wet etching.

8. The method of claim 4, wherein 100–500 Å of the nitride film is removed while wet etching in order to form the rounded surface.

* * * * *

UNITED STATES PATENT AND TRADEMARK OFFICE
CERTIFICATE OF CORRECTION

PATENT NO. : 5,897,353
DATED : April 27, 1999
INVENTOR(S) : Kim et al.

It is certified that error appears in the above-identified patent and that said Letters Patent is hereby corrected as shown below:

In column 4, line 9, delete "accelerate the growth" and insert -- accelerate a growth -- .

Signed and Sealed this

Sixteenth Day of January, 2001

*Attest:*

Q. TODD DICKINSON

*Attesting Officer*   *Commissioner of Patents and Trademarks*